United States Patent
Shim

(10) Patent No.: US 10,741,709 B2
(45) Date of Patent: Aug. 11, 2020

(54) VENTILATIVE SOLAR CELL AND SOLAR CELL MODULE

(71) Applicant: KYUNG IL GREEN TECH CO., LTD., Seosan-si (KR)

(72) Inventor: Eon Kyu Shim, Yongin-si (KR)

(73) Assignee: KYUNG IL GREEN TECH CO., LTD., Seosan-si (KR)

(*) Notice: Subject to any disclaimer, the term of this patent is extended or adjusted under 35 U.S.C. 154(b) by 0 days.

(21) Appl. No.: 16/091,719

(22) PCT Filed: Jun. 20, 2017

(86) PCT No.: PCT/KR2017/006467
§ 371 (c)(1),
(2) Date: Oct. 5, 2018

(87) PCT Pub. No.: WO2018/012748
PCT Pub. Date: Jan. 18, 2018

(65) Prior Publication Data
US 2019/0123220 A1    Apr. 25, 2019

(30) Foreign Application Priority Data

Jul. 12, 2016 (KR) .................. 10-2016-0087931

(51) Int. Cl.
*H01L 31/0224* (2006.01)
*H01L 31/042* (2014.01)
(Continued)

(52) U.S. Cl.
CPC ............ *H01L 31/042* (2013.01); *H01L 31/02* (2013.01); *H01L 31/0224* (2013.01);
(Continued)

(58) Field of Classification Search
CPC ... H01L 31/042; H01L 31/02; H01L 31/0224; H01L 31/02243; H01L 31/0521; H02S 40/38; H02S 40/42
See application file for complete search history.

(56) References Cited

U.S. PATENT DOCUMENTS

2008/0289680 A1* 11/2008 MacFarlane .......... H01L 31/024
136/246
2009/0139568 A1*  6/2009 Weidman ........ H01L 31/022425
136/256
(Continued)

FOREIGN PATENT DOCUMENTS

CN       102405380       4/2012
CN       204481759       7/2015
(Continued)

OTHER PUBLICATIONS

International Search Report—PCT/KR2017/006467 dated Sep. 15, 2017.

*Primary Examiner* — Jayne L Mershon
(74) *Attorney, Agent, or Firm* — Cantor Colburn LLP

(57) ABSTRACT

Provided is a ventilative solar cell and a solar cell module. The solar cell includes: a cell substrate; and a photoelectric conversion layer formed on the cell substrate so as to convert solar energy into electrical energy, wherein the cell substrate and the photoelectric conversion layer include a plurality of through holes that form an air passage extending from a front surface of the solar cell, on which sunlight is incident, to a rear surface thereof.

8 Claims, 11 Drawing Sheets

(51) Int. Cl.
*H02S 40/38* (2014.01)
*H02S 40/42* (2014.01)
*H01L 31/02* (2006.01)
*H01L 31/052* (2014.01)
*H01L 31/068* (2012.01)

(52) U.S. Cl.
CPC .. *H01L 31/022433* (2013.01); *H01L 31/0521* (2013.01); *H02S 40/38* (2014.12); *H02S 40/42* (2014.12); *H01L 31/068* (2013.01); *Y02E 10/50* (2013.01)

(56) References Cited

U.S. PATENT DOCUMENTS

| | | |
|---|---|---|
| 2010/0008078 A1 | 1/2010 | Zhang et al. |
| 2010/0288265 A1 | 11/2010 | Madsen |
| 2011/0005516 A1 | 1/2011 | Xiang et al. |
| 2013/0025586 A1* | 1/2013 | Hack ............. F24S 70/16 126/664 |
| 2014/0150851 A1 | 6/2014 | Tsuji et al. |
| 2014/0338727 A1 | 11/2014 | Kwon |

FOREIGN PATENT DOCUMENTS

| | | |
|---|---|---|
| CN | 204834647 | 12/2015 |
| CN | 105304731 | 2/2016 |
| CN | 205335275 | 6/2016 |
| JP | 2013093524 | 5/2013 |
| KR | 101118123 | 3/2012 |
| KR | 101154729 | 6/2012 |
| KR | 20120133729 | 12/2012 |
| KR | 20160012930 | 2/2016 |
| KR | 20160022662 | 3/2016 |
| WO | 2008073908 | 6/2008 |
| WO | 2010086443 | 8/2010 |

* cited by examiner

VENTILATIVE SOLAR CELL AND SOLAR CELL MODULE

TECHNICAL FIELD

The present invention relates to a ventilative solar cell and a ventilative solar cell module and, more particularly, to a solar cell and a solar cell module each having a through hole to be capable of ventilative for improving cooling efficiency thereof.

BACKGROUND ART

Globally, effects of climate change have caused crisis of environmental destruction and high oil price, and with the accelerated depletion of oil energy and environmental pollution, the development of new and renewable energy and related devices has become urgent.

In this situation, technical development focuses on new and renewable energy development using natural energy such as wind power, tidal power, solar power, and hydro power, and solar cells are a typical example.

Types of solar cells include mono-crystalline and poly-crystalline silicon solar cells, a compound-based thin film solar cell such as CIGS (copper indium gallium selenide thin-film solar cells), DdTe (cadmium telluride thin-film solar cells), and other organic-substances, dye-sensitized and nano-particle solar cells, but all such solar cells and solar cell modules have a problem that efficiency of the solar cells and solar cell modules is significantly reduced under increasing temperature thereof.

Referring to FIG. 1, DC voltage and DC current fluctuate according to temperature change, but it can be seen that the DC current changes more than the DC voltage. In Korea, for example, since surface temperature of a solar cell and a solar cell module on which sunlight is incident rises up to a temperature of 55° at noon, relatively low current is generated in comparison to generated voltage of the solar cell or the solar cell module, and generating efficiency is significantly reduced.

In this case, natural cooling by wind and wind pressure difference is a way to increase the DC current without great cost, but existing solar cells and solar cell modules are provided with unventilated structures.

Meanwhile, in Korean Patent Application Publication No. 10-2016-0022662 (published on Mar. 2, 2016), although it has been disclosed that a ventilative space is provided between cover plates provided in upper part of a solar cell and a solar cell module, there is a limit to increase cooling efficiency because structures of the solar cell and the solar cell module cannot facilitate passage of wind through the solar cell.

DISCLOSURE

Technical Problem

An object of the present invention is to provide a solar cell and a solar cell module capable of improving natural cooling efficiency by providing a through hole on a substrate of the solar cell or the solar cell module so that wind passes through the hole.

Technical Solution

According to an embodiment of the present invention, a solar cell provided with a through hole includes: a cell substrate; and a photoelectric conversion layer formed on the cell substrate, so as to convert solar energy into electrical energy, wherein the cell substrate and the photoelectric conversion layer include a plurality of through holes that form an air passage from a front surface of the solar cell to a rear surface thereof.

According to another embodiment of the present invention, a solar cell module provided with a through hole includes: a module substrate; and a plurality of solar cells disposed on the module substrate, wherein the module substrate has a plurality of through holes on areas between the plurality of solar cells, the through holes forming an air passage extending from a front surface of the module substrate to a rear surface thereof.

Advantageous Effects

As described above, the solar cell and the solar cell module according to the present invention provides a through hole on a substrate of the solar cell or the solar cell module so that wind moves through a center portion of the solar cell or the solar cell module, thereby improving natural cooling efficiency without using a separated cooling device.

As improving the natural cooling efficiency, efficiencies of the solar cell and the solar cell module may be improved.

Furthermore, as the inserting members of a funnel structure are inserted in the through holes, a wind pressure difference passed through the through holes may be increased, therefore difference in pressure and temperature between a surface on which sunlight is incident and an opposed surface thereof are increased, and the cooling efficiency may be further improved.

In addition, the solar cell and the solar cell module of the present invention may be designed to be structurally stronger than a conventional solar cell or solar cell module against wind loads.

MODE FOR INVENTION

Figure 1:
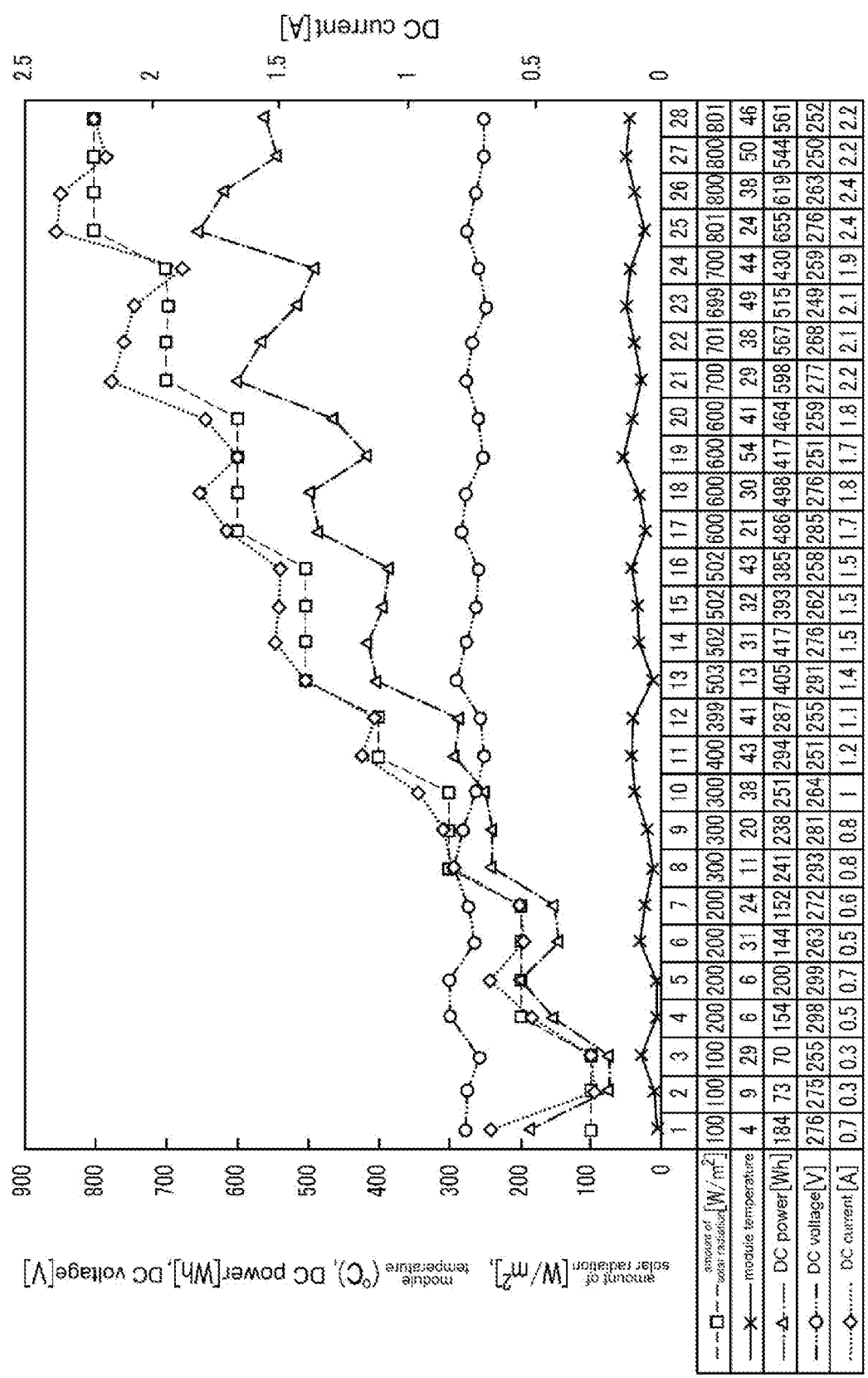
FIG. 1 is a graph showing a current variation of a solar cell according to amount of sunlight incidence and temperature change.

Hereinbelow, exemplary embodiments of the present invention will be described in detail with reference to the accompanying drawings such that the invention can be easily embodied by one of ordinary skill in the art to which this invention belongs. However, the present invention may be embodied in many different forms and should not be construed as limiting the embodiments of the present invention described herein. Further, in the accompanying drawings, components unrelated to the description will be omitted when it may be unclear to describe the present invention, and similar reference numerals are used throughout this specification to designate the similar components.

Unless the context clearly indicates otherwise, it will be further understood that the terms "comprises", "comprising", "includes", and/or "including" when used in this specification, specify the presence of states features, integers, steps, operations, elements, and/or components, but do not preclude the presence or addition of one or more other features, integers, steps, operations, elements, components, and/or groups thereof.

Hereinafter, embodiments of the present invention will be described with reference to accompanying drawings in detail.

Figure 2:
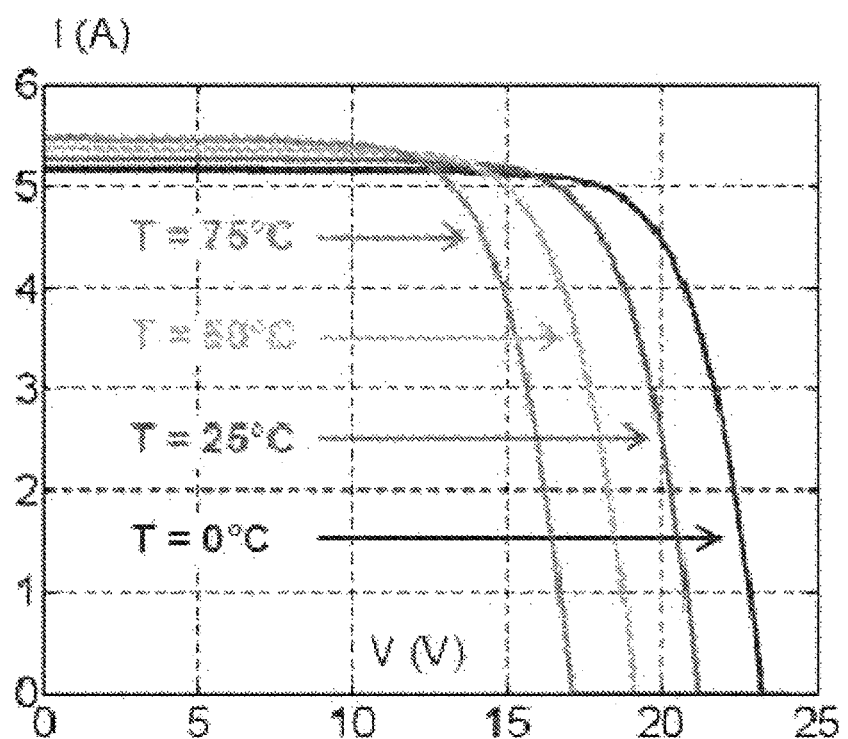
FIG. 2 is a graph showing a current-voltage characteristic according to temperature of the solar cell.

First, referring to FIG. 2, voltage and current characteristics of a solar cell or a solar cell module depend on temperature thereof. In general, when the temperature is high, the voltage characteristic is lowered, and generating efficiency is reduced. For this reason, the solar cell and the solar cell module are exposed to sunlight for a long time and the temperature thereof become high, so that the generating efficiency may be lowered.

Figure 3:
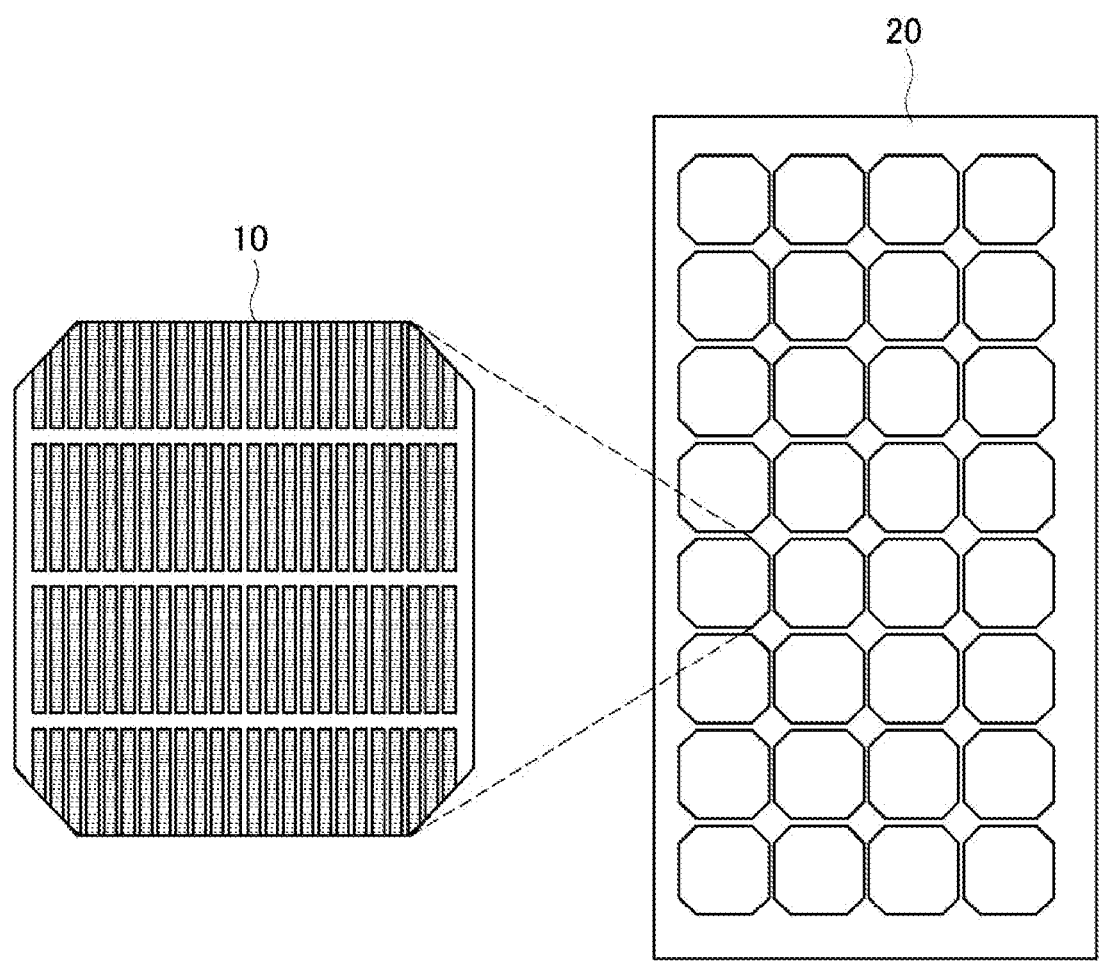
FIG. 3 is a structural view showing a relationship between a solar cell and a solar cell module.

In general, the solar cell and the solar cell module are configured as shown in FIG. 3.

Referring to FIG. 3, the solar cell module 20 includes a module substrate and a plurality of solar cells 10 (or a solar cell 10). The plurality of solar cells 10 is formed in a matrix structure on the module substrate. For example, it may be disposed in a checkerboard pattern.

When enlarged, each solar cell 10 may have the same structure, as the left-side view of FIG. 3.

The solar cell 10 is a semiconductor that directly converts the sunlight into electricity using a photovoltaic effect in which electrons are generated when a semiconductor layer forming a p-n junction is irradiated with light.

Herein, the solar cell 10 has the cell substrate and the photoelectric conversion layer formed on the cell substrate so as to convert solar energy into electrical energy.

Although there are various types of solar cells 10, in case of general silicon solar cells 10, a p-type silicon substrate may be the cell substrate. The photoelectric conversion layer includes an n-type semiconductor layer in which pentavalent element is thermally diffused and formed on a front surface of the silicon substrate, thereby forming the p-n junction on the silicon substrate. Then the photoelectric conversion layer includes a silicon nitride layer, and further includes an anti-reflection layer formed on the n-type semiconductor layer.

In addition, the photoelectric conversion layer may include an electrode for transferring electrons generated from light to a load, and the electrode includes front and rear electrodes formed on upper and lower surfaces of the photoelectric conversion layer.

In the silicon substrate, the front electrode on the anti-reflection layer generally includes finger-bars formed of a plurality of parallel lines in very narrow width of 70~100 μm and several bus-bars in wide width (1.5~2 m). Referring to the left-side view of FIG. 3, the finger-bars are formed on areas without pattern and arranged in vertical direction. The bus-bars are arranged in horizontal direction perpendicular to the finger bar and also formed on areas without pattern. Referring to FIG. 3, the bus-bars are formed in larger areas than areas of the finger-bars.

The front electrode is formed by screen printing silver paste on the silicon substrate at high temperature, and the rear electrode is formed by spreading aluminum paste on the whole silicon substrate. The aluminum rear electrode may become in poor electronic and mechanical contact with a metal ribbon for connecting cells because of surface oxidation, so that the rear electrode should be formed by screen printing aluminum silver paste with a rear bus-bar. Electrode paste of the front and rear surfaces is formed by being plastic at temperatures above 800° C., and the silver paste of the front electrode penetrates the anti-reflection layer and is connected to the n-type layer.

In general, voltage available in a unit silicon solar cell 10 is less than 1V lower than the practical level. Therefore, a silicon solar cell module 20 generating electricity using the solar cell 10 is manufactured such that a plurality of solar cells 10 is connected to each other in series and parallel for generating predetermined voltage and current.

Meanwhile, the solar cell according to an embodiment of the present invention may include all solar cells as well as the silicon solar cell described above.

Furthermore, unlike described above, the structure of the solar cell 10 is configured such that the photoelectric conversion layer including the semiconductor layer forming the p-n junction is provided on a substrate such as glass on which impurities are nor processed, metal or plastic, etc.

Figure 4A:
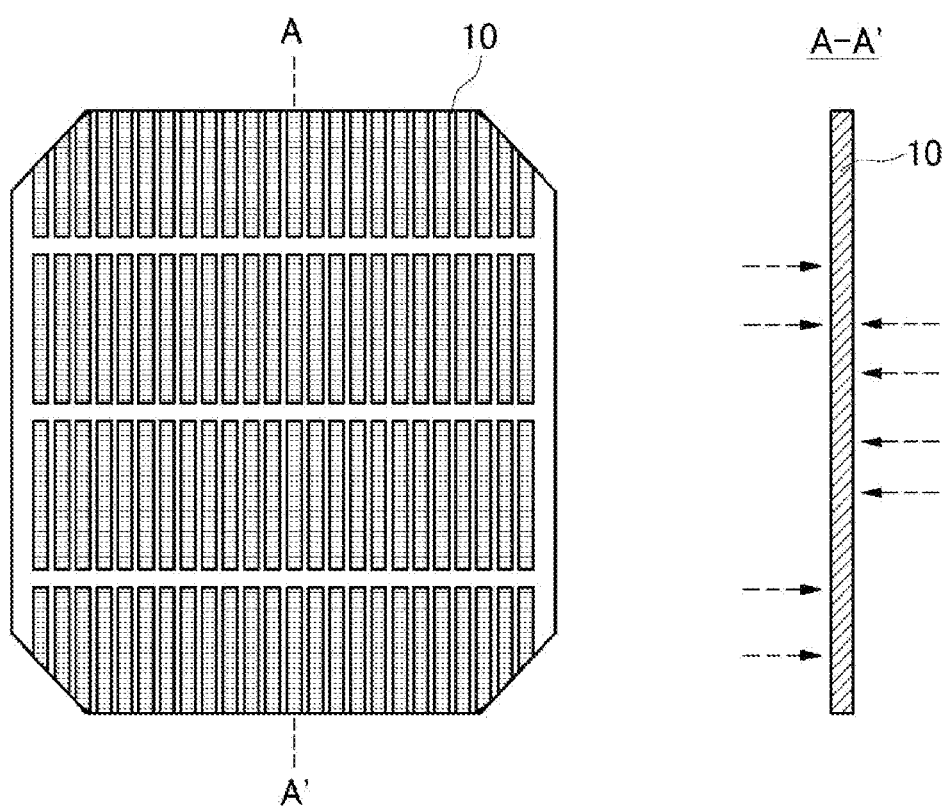
FIG. 4a is a view showing the structure of a solar cell according to a related art.

Referring to FIG. 4a, a conventional solar cell 10 is formed with an integrated cell substrate and does not include a process for forming any of holes on the substrate. Therefore, even though air flows in a direction of an arrow of FIG. 4a, the solar cell 10 does not have an area through which the air can pass, so that wind cannot pass through the conventional solar cell 10.

Figure 4B:
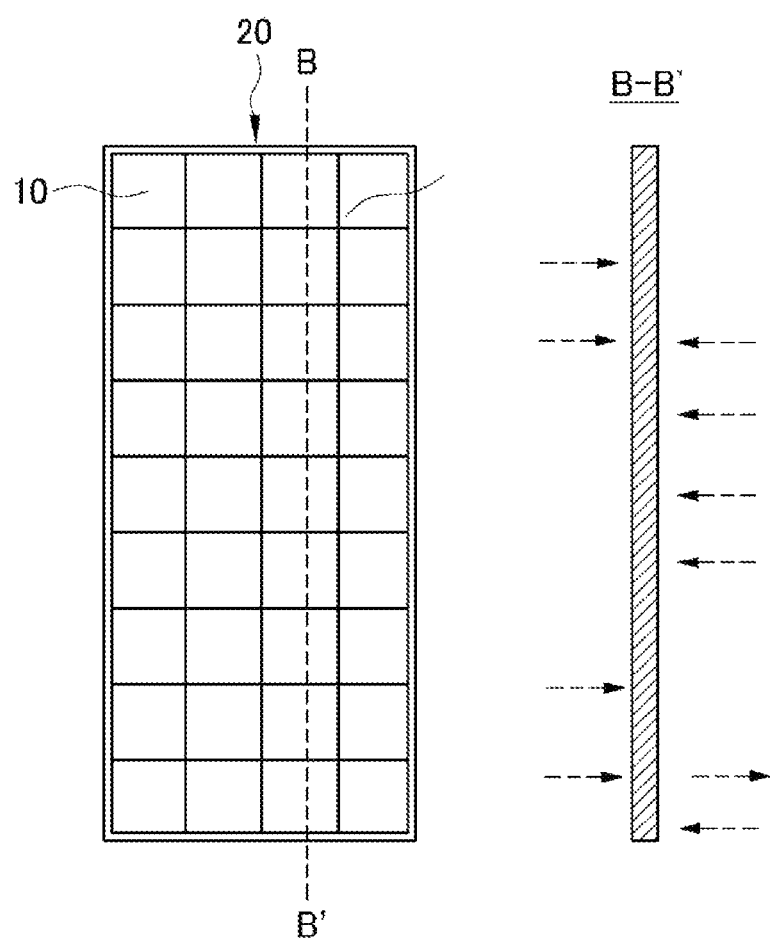
FIG. 4b is a view showing the structure of a solar cell module according to a related art.

Referring to FIG. 4b, a conventional solar cell module 20 is also formed with an integrated module substrate and does not include a process for forming any of holes on the module substrate. Therefore, even though air flows in a direction of an arrow of FIG. 4b, wind cannot pass through the conventional solar cell module 20.

In other words, since the conventional solar cell 10 and the conventional solar cell module 20 have a structure in which wind cannot pass through the solar cell and the module, so that natural ventilation cannot be generated. Also, the wind blowing from the outside cannot pass through a surface of the solar cell 10, and thus a cooling effect of the solar cell 10 is not excellent. In addition, the solar cell 10 directly receives pressure from the wind blowing from the outside, so that the solar cell 10 is significantly influenced by wind loads.

Furthermore, in the embodiment of the present invention, since through holes 110 are respectively provided on a solar cell 100 and a solar cell module 200, natural ventilation is facilitated through a surface of the solar cell 100, so that the cooling efficiency may be improved and the effect of wind loads may be reduced.

Figure 5A:
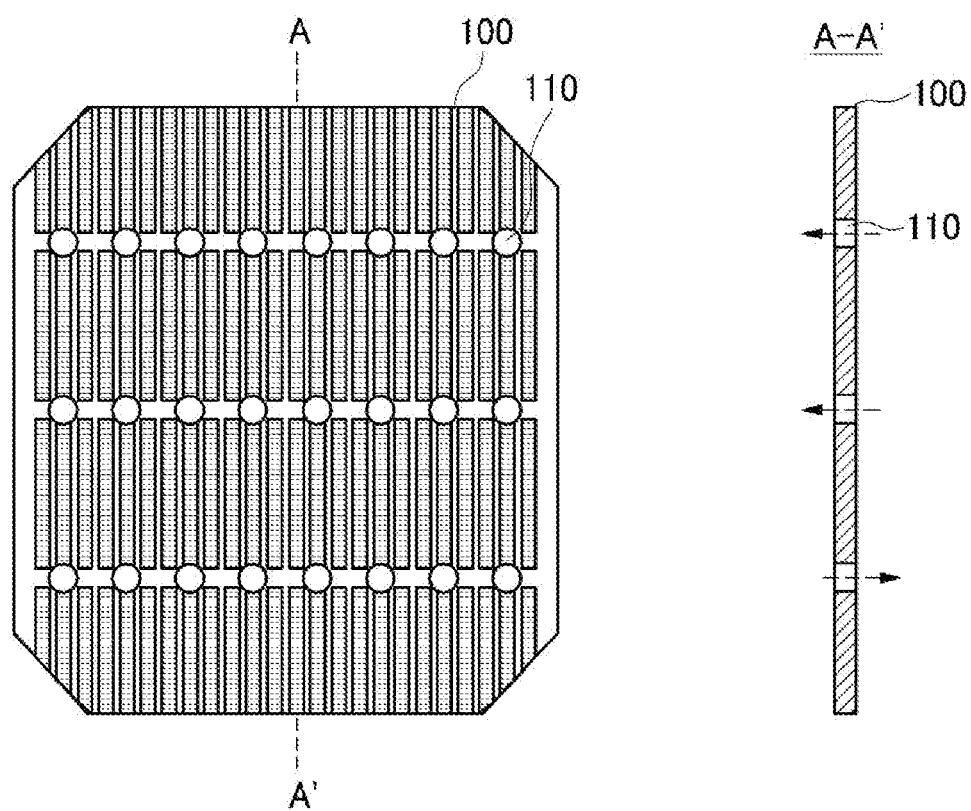
FIG. 5a is a view showing the structure of a solar cell according to an embodiment of the present invention.

Referring to FIG. 5a, in the solar cell 100 according to the embodiment of the present invention, a plurality of through holes 110 is formed to pass through the cell substrate and a photoelectric conversion layer, thus forming air passages from a front surface of the solar cell 100 to a rear surface thereof. Direction of the wind flowing in the air passage may be a rearward direction or a frontward direction as shown in FIG. 5a.

In addition, the plurality of through holes 110 is formed by being spaced apart from each other at regular intervals, and is formed in a matrix structure, in which a row spacing of the matrix structure is wider than a column spacing thereof.

The through hole 110 is formed on an electrode of the solar cell 100. More particularly, a front electrode of the solar cell 100 may be configured with a plurality of bus-bars arranged horizontally at regular intervals and a plurality of finger-bars arranged vertically at regular intervals, as shown in FIG. 5a. The through holes 110 are formed on the plurality of bus-bars, alternatively, and although not shown in drawings, they are formed on the plurality of finger-bars.

In this case, when the through hole 110 has same diameter as widths of the finger-bar and the bus-bar, a path in which the electricity is transferred to an external load through the electrode may be broken. Therefore, it is preferable that the through hole 110 is formed with a diameter smaller than the widths of the finger-bar and the bus-bar.

Figure 5B:
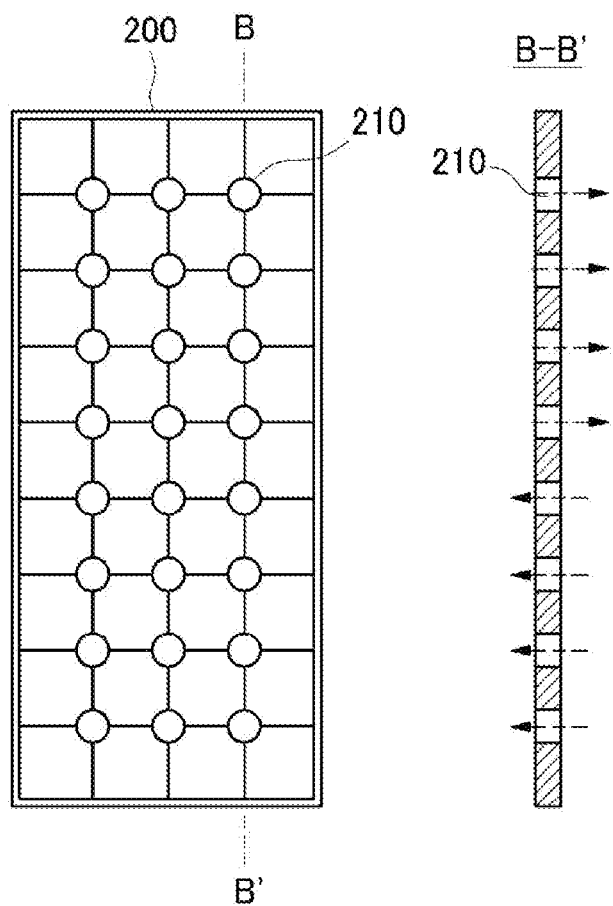
FIG. 5b is a view showing the structure of a solar cell module according to an embodiment of the present invention.

Referring to FIG. 5b, the solar cell module 200 according to the embodiment of the present invention includes a module substrate and a plurality of solar cells 100 arranged on the module substrate. The module substrate may include a plurality of through holes 210 on areas between the plurality of solar cells 100, wherein the through holes forms an air passage extending from a front surface of the module substrate to a rear surface thereof.

The plurality of through holes 210 may be formed by being spaced apart from each other at regular intervals and being equally spaced apart from each other in upper, down, left, and right directions.

More particularly, the plurality of solar cells 100 is arranged in a matrix structure, and the plurality of through holes 210 may be formed respectively on cross areas where four solar cells 100 face each other. Therefore, as shown in FIG. 5b, the solar cells 100 are contacted with each other, but actually the solar cells 100 are arranged by being spaced apart from each other. In this case, a photoelectric transformation related configuration such as the semiconductor layer or the electrode may not be formed on spacing areas, but the through hole 210 may be formed leaving the spacing areas intact.

In general solar cell 100 or solar cell module 200, a front surface facing the sun directly receives solar radiant heat while a rear surface does not directly receive solar radiant heat, so that the rear surface is relatively lower in temperature than the front surface. In this situation, when the through hole 210 is provided in the solar cell or the solar cell module, air naturally flows in the through hole 210 by convection effect caused by temperature difference, therefore, an effect of generating natural ventilation may be obtained.

Figure 6A:
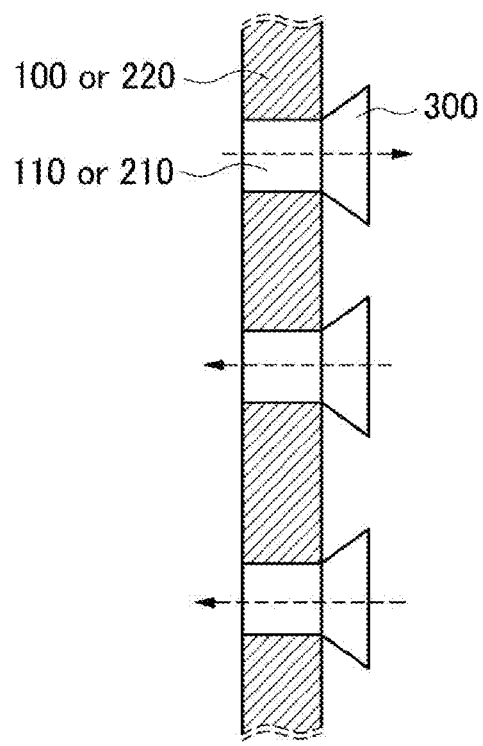
FIGS. 6a and 6b are views showing the structure of a ventilation improving member according to an embodiment of the present invention.
Figure 6B:
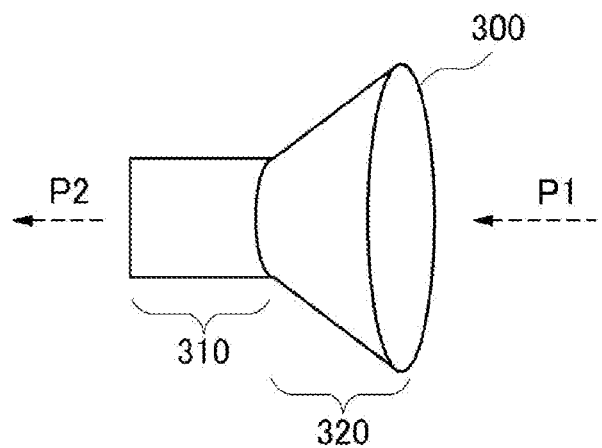
Figure 7A:
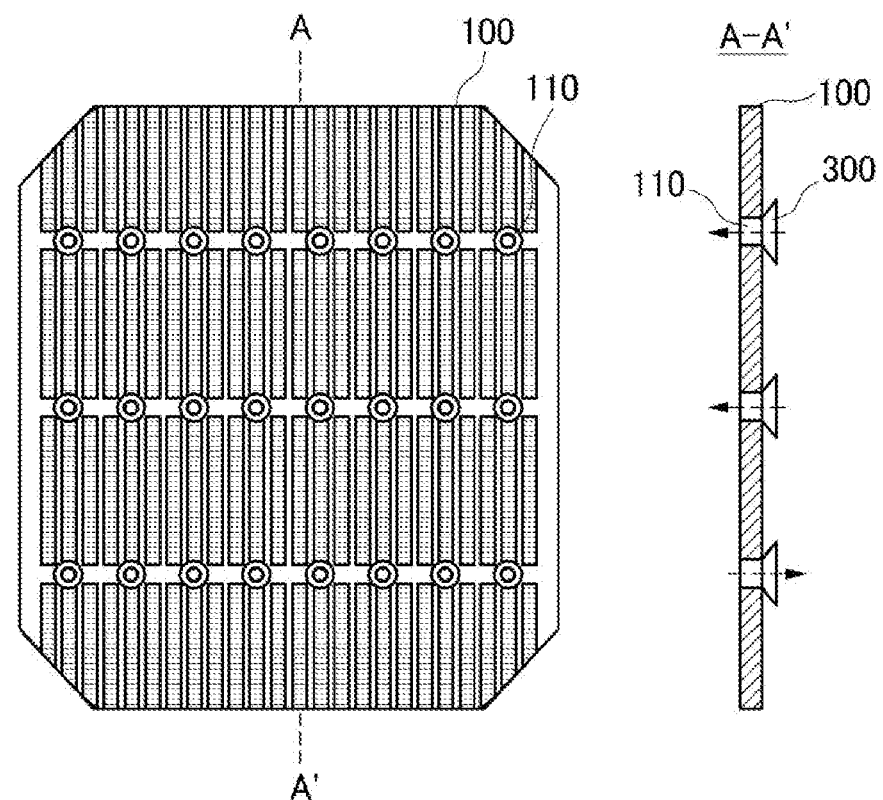
FIG. 7a is a view showing the structure of a solar cell in which the ventilation improving member according to the embodiment of the present invention is applied.
Figure 7B:
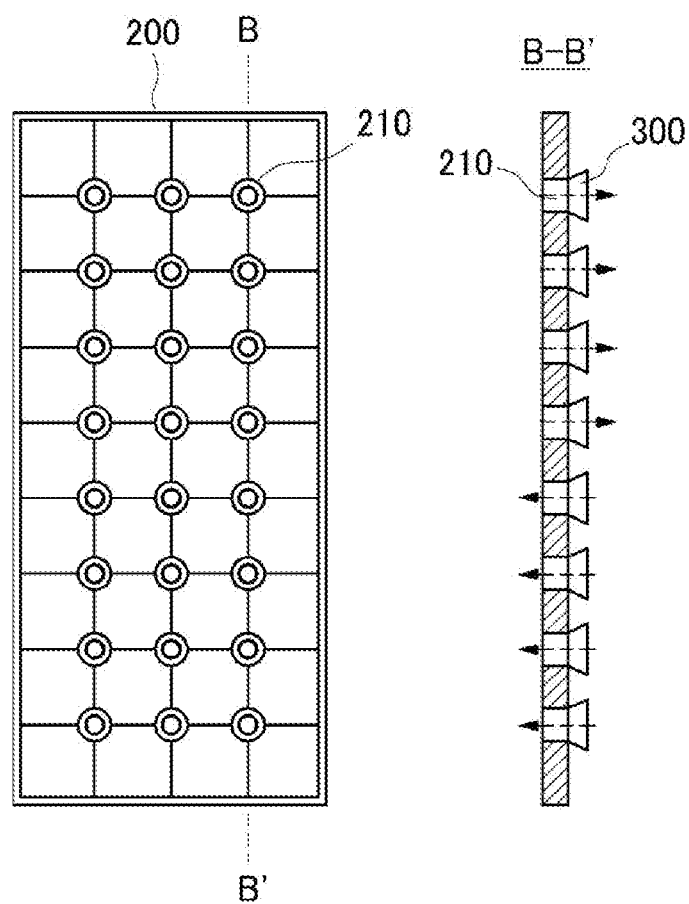
FIG. 7b is a view showing the structure of a solar cell module in which the ventilation improving member according to the embodiment of the present invention is applied.

Hereinafter, referring to FIGS. 6a to 7b, a ventilation improving member 300 according to another embodiment of the present invention will be described. FIGS. 6a and 6b are a sectional view and a detail view of the ventilation improving member 300, respectively, and FIGS. 7a and 7b are views showing the structures of the solar cell 100 and the solar cell module 200 in which ventilation improving members 300 are inserted.

The ventilation improving member 300 is formed corresponding to each through hole 110 or 210, and may be inserted into at least one of the plurality of through holes 110 or 210.

The ventilation improving member 300 may be formed in a funnel shape as shown in the drawings.

More particularly, the ventilation improving member 300 includes an insertion part 210 formed in a tubular shape corresponding to the through hole 110 or 210, and a wind pressure difference generating part 320 extending from a first end of the insertion part 210 and having a diameter larger than a diameter of the insertion part 210.

The insertion part 310 is provided to be inserted into the solar cell 100 or the solar cell module 200 as shown in FIG. 6a, and may have the same shape as a shape of the through hole 110 or 210.

The wind pressure difference generating part 320 is disposed to protrude from the surface of the solar cell 100 or the solar cell module 200, and extends from the first end of the insertion part 310. Specifically, the wind pressure difference generating part 320 may have a larger diameter as the wind pressure difference generating part extends from the first end of the insertion part 310.

In this case, wind pressure difference is generated between wind power P1 generated from a first end of the ventilation improving member 300 and power P2 generated from a second end thereof. Because a first area of the wind power P1 through which air passes is relatively wider than a second area of the wind power P2 through which air passes, a pressure difference due to air flow is generated. Therefore, when the solar cell and the solar cell module have only the through holes 110 or 210, air is forcibly circulated under an effect of the temperature difference and holes. However, when the ventilation improving member 300 is further provided in the solar cell 100 or the solar cell module 200, since speed of the air circulation is faster, the natural cooling efficiency may be further increased. In addition, when strong wind from the outside is blown to the solar cell 100 or the solar cell module 200, the wind may pass through the through hole 110 or 210 through the ventilation improving member 300 easier than having only the through hole 100 or 210, it is possible to reduce the wind loads on the surface of the solar cell 100 or the solar cell module 200. Accordingly, the solar cell 100 and the solar cell module 200 may have safety characteristics from natural disasters such as wind due to a typhoon.

In an additional embodiment not shown in the drawings, when the plurality of ventilation improving members 300 is inserted in the solar cell 100 (or the solar cell module 200), some of the ventilation improving members 300 are inserted such that the wind pressure difference generating parts 320 of the remaining ventilation improving members are positioned on the front surface of the solar cell 100 (or the solar cell module 200), and the remaining ventilation improving members 300 are inserted such that the wind pressure difference generating parts 320 of the remaining ventilation improving members are positioned on the rear surface of the solar cell 100 (or the solar cell module 200). In other words, since the wind may be generated in different directions, the ventilation improving members 300 may be inserted in different directions.

Figure 8:
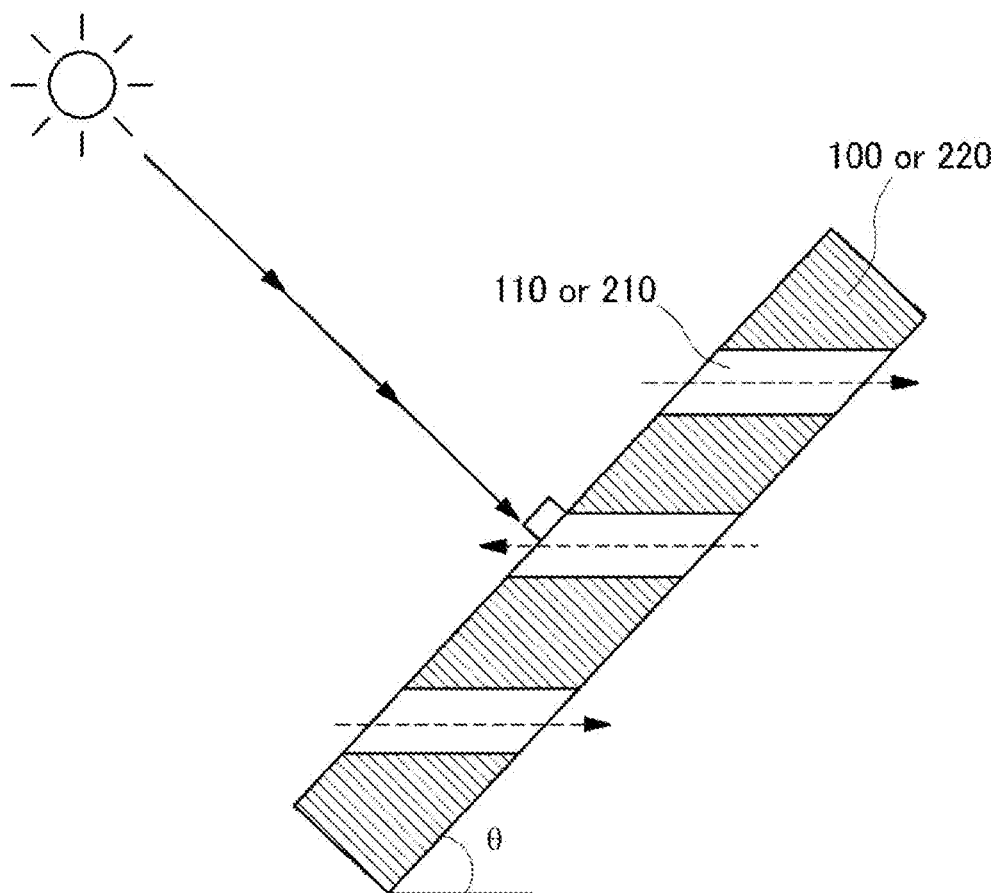
FIG. 8 is a sectional view showing a solar cell or a solar cell module, in which a through hole according to another embodiment of the present invention is applied.

Referring to FIG. 8, in a further embodiment of the present invention, the through holes 110 or 210 may be provided at an inclined angle with respect to the solar cell 100 or the solar cell module 200. In general, the inclined angle θ of which the solar cell 100 and the solar cell module 200 are inclined respect to the ground are a sum of 15° with latitude of area in which the solar cell 100 and the solar cell module 200 are located. The angle may be an angle for the solar cell 100 or the solar cell module 200 to receive sunlight vertically for long time. This is because generating efficiency is highest when an incidence angle of sunlight is 90°. In addition, in order for the wind to easily pass through the through hole 100 or 210 of the solar cell 100 or the solar cell module 200, the through hole 100 or 210 should be provided in a direction parallel with the ground. Accordingly, the through hole 110 or 210 should be provided parallel with the ground, and the through hole 110 or 210 is preferably inclined at the angle θ with respect to the surface of the solar cell 100 or the solar cell module 200.

Descriptions of the present invention have been disclosed for illustrative purposes, those skilled in the art to which the present invention belongs will appreciate that various modifications, additions and substitutions are possible, without departing from the scope and spirit of the present invention. Therefore, it should be understood that the embodiments described above are exemplary in all respects and is not limited to a specific description. For example, each component described as a single type may be operated in dispersed, component described as being dispersed may also be operated in coupled form.

The scope of the present invention is specified by the claims below rather than the description above, and all modifications or modified forms derived from the meaning, scope and equivalent concept of the patent claim should be interpreted as included within the scope of the present invention.

DESCRIPTION OF REFERENCE NUMERALS 10, 100: solar cell
110, 120: through hole
20, 200: solar cell module
300: ventilation improving member

The invention claimed is:

1. A solar cell provided with through hole, the solar cell comprising:
   a cell substrate; and
   a photoelectric conversion layer formed on the cell substrate so as to convert solar energy into electrical energy,
   wherein the cell substrate and the photoelectric conversion layer include a plurality of through holes that form an air passage extending from a front surface of the solar cell, on which sunlight is incident, to a rear surface thereof,
   the photoelectric conversion layer comprises a semiconductor layer and a front electrode formed on an upper part of the semiconductor layer,
   wherein the front electrode comprises a plurality of bus-bars arranged horizontally at regular intervals and a plurality of finger-bars arranged vertically at regular intervals, and
   the plurality of through holes is provided on the plurality of bus-bars or on the plurality of finger-bars, and is formed with a diameter smaller than widths of the finger-bar and the bus-bar.

2. The solar cell of claim 1, wherein the plurality of through holes is formed by being spaced apart from each other at regular intervals.

3. The solar cell of claim 1, wherein the plurality of through holes is formed in a matrix structure, and a row spacing of the matrix structure is wider than a column spacing thereof.

4. The solar cell of claim 1, further comprising:
   at least one ventilation improving member inserted in at least one of the plurality of through holes.

5. The solar cell of claim 4, wherein the ventilation improving member is formed in a funnel shape.

6. The solar cell of claim 4, wherein the ventilation improving member includes:
   an insertion part formed in a tubular shape corresponding to each of the through holes; and
   a wind pressure difference generating part extending from a first end of the insertion part and having a diameter larger than a diameter of the insertion part.

7. The solar cell of claim 6, wherein the wind pressure difference generating part is configured such that the diameter thereof becomes larger as the wind pressure difference generating part extends from the first end of the insertion part.

8. The solar cell of claim 6, wherein when a plurality of ventilation improving members is inserted in the solar cell, some of the ventilation improving members are inserted such that the wind pressure difference generating parts thereof are positioned on the front surface of the solar cell, and the remaining ventilation improving members are inserted such that the wind pressure difference generating parts thereof are positioned on the rear surface of the solar cell.

* * * * *